United States Patent [19]

Park et al.

[11] Patent Number: 5,482,886

[45] Date of Patent: Jan. 9, 1996

[54] METHOD FOR FABRICATING DYNAMIC RANDOM ACCESS MEMORY CAPACITOR

[75] Inventors: Cheoul S. Park; Dong Y. Keum, both of Kyoungki-do, Rep. of Korea

[73] Assignee: Hyundai Electronics Industries Co., Ltd., Kyoungki-Do, Rep. of Korea

[21] Appl. No.: 297,420

[22] Filed: Aug. 29, 1994

[30] Foreign Application Priority Data

Aug. 30, 1993 [KR] Rep. of Korea ............... 1993-17002

[51] Int. Cl.⁶ ..................................... H01L 21/8242
[52] U.S. Cl. ................ 437/60; 437/52; 437/919; 437/47; 148/DIG. 14
[58] Field of Search ..................... 437/47, 48, 52, 437/49, 60, 919; 148/DIG. 14

[56] References Cited

U.S. PATENT DOCUMENTS

| | | | |
|---|---|---|---|
| 5,326,714 | 7/1994 | Liu et al. | 437/52 |
| 5,374,577 | 12/1994 | Tuan | 437/52 |
| 5,389,560 | 2/1995 | Park | 437/52 |
| 5,389,566 | 2/1995 | Lage | 437/52 |

*Primary Examiner*—Tuan H. Nguyen
*Attorney, Agent, or Firm*—Popham, Haik, Schnobrich & Kaufman, Ltd.

[57] ABSTRACT

A method for fabricating a DRAM capacitor, including the steps of forming a double contact hole structure by utilizing an insulating spacer two times, filling only the lower portion of the contact hole, forming a pattern having an undercut portion from two insulating films exhibiting a superior wet etch rate difference, coating a conduction layer over the pattern to form an insulating spacer from a portion of the conduction layer disposed on the stepped pattern portion, and etching the resulting structure at its full surface using the insulating spacer as a mask to isolate a capacitor to be finally formed, whereby a capacitor electrode having a double rectangular frame shape is formed. With such a structure, the inner area of the contact hole can be used as a part of the capacitor, thereby enabling the surface area of capacitor to be increased. Since no separate mask is used for the etching step, it is possible to simplify the fabrication of DRAM capacitor. Furthermore, the fabricated DRAM capacitor has a reduced contact area and an increased surface area. This achieves an increase in capacitance and improvement in integration degree while reducing the topology.

6 Claims, 4 Drawing Sheets

METHOD FOR FABRICATING DYNAMIC RANDOM ACCESS MEMORY CAPACITOR

BACKGROUND OF THE INVENTION

1. Field of the Invention

The present invention relates to a method for fabricating a dynamic random access memory (DRAM) capacitor, and more particularly to a method for fabricating a DRAM capacitor, capable of increasing the surface area and thereby the capacitance while reducing the topology.

2. Description of the Prior Art

Recent high integration trend of DRAM involves inevitably a reduction in cell dimension. However, such a reduction in cell dimension results in a difficulty to form capacitors having a sufficient capacitance. This is because the capacitance is proportional to the surface area of capacitor. In a case of a DRAM device constituted by one MOS transistor and one capacitor, in particular, it is important to reduce the cell dimension and yet obtain a high capacitance of the capacitor, for the high integration of the DRAM device.

Capacitance of such a capacitor is proportional to dielectric constant of a dielectric film and surface area of an electrode and is reversely proportional to thickness of the dielectric film.

For increasing the capacitance, there have been various researches. For example, there have been known use of a dielectric material exhibiting a high dielectric constant, formation of a thin dielectric layer, formation of a capacitor having an increased surface area. Although various material have been proposed as the dielectric material exhibiting a high dielectric constant, they have not been confirmed in reliance and thin film characteristic such as junction breakdown voltage. The reduction in thickness of dielectric layer results in damage of the dielectric layer severely affecting the reliance of capacitor. For increasing the surface area of capacitor, a complex process should be used. Furthermore, the increase in surface area results in a degradation in integration degree.

Generally, existing capacitors includes a conduction layer comprised of a polysilicon layer and a dielectric layer comprised of an oxide film, a nitride film or a combination thereof. For an increase in surface area of capacitor, the polysilicon layer has a multi-layer structure and spacers having a pin shape, a cylindrical shape or a rectangular frame shape extending through the multi-layer structure to connect layers of the multi-layer structure.

Now, a description will be made in conjunction with the pin-shaped capacitor.

For fabricating the pin-shaped capacitor, first, an interlayer insulating film and a first planarizing layer are sequentially formed over a semiconductor substrate having a field oxide film at its element isolation region and elements such as a gate oxide film and a gate at its active region, thereby planarizing the semiconductor substrate. Thereafter, a first conduction layer, a first insulating film, a second conduction layer and a second insulating film are sequentially formed over the first planarizing layer.

Subsequently, all the layers formed over the semiconductor substrate are sequentially removed at their portions disposed over a portion of the semiconductor substrate defined as the active region to be in contact with a capacitor, thereby forming a contact hole. A third conduction layer is coated over the resulting structure so as to fill the contact hole. Over the third conduction layer, a third insulating film is formed. Thus, a pin-shaped capacitor is obtained which has a structure of vertically connecting the conduction layers with one another.

Although the conventional pin-shaped capacitor has an increased surface area because it is of the multi-layer structure, it still has an insufficient capacitance due to the high integration of a DRAM device employing it. As a result, the DRAM device encounters a degradation in reliance of its operation. Since the capacitor had the multi-layer structure, an increase in topology occurs, thereby causing subsequent layers to be degraded in capability of coating steps.

On the other hand, in fabrication of the cylindrical capacitor, a conduction layer is coated over a planarizing layer of a semiconductor substrate structure obtained after formation of a contact hole through which an active region of the semiconductor substrate to be in contact with a capacitor, so as to fill the contact hole. An insulating film pattern having a cylindrical bar shape is then formed on a portion of the conduction layer disposed over the contact hole. Side walls having the shape of spacer is formed around the cylindrical bar by using a conduction material, so as to isolate the cylindrical bar. Thus, a cylindrical capacitor is obtained.

Although the cylindrical capacitor has an advantage of a reduced topology, as compared with the pin-shaped capacitor, it encounters a degradation in integration degree because it should occupy a large area for obtaining a sufficient capacitance, due to its small surface area. Of course, the capacitance may be increased by repeatedly forming cylindrical side walls to be shaped into a plurality of concentric circles. In this case, however, the overall fabrication becomes complex.

SUMMARY OF THE INVENTION

Therefore, an object of the invention is to solve the above-mentioned problems encountered in the prior art and, thus, to provide a method for fabricating a DRAM capacitor having a combination of the pin-shaped structure and the cylindrical structure by using insulating films exhibiting a difference in etch selectivity and thereby capable of increasing the capacitance and yet reducing the topology to improve the integration degree.

In accordance with the present invention, this object can be accomplished by providing a method for fabricating a dynamic random access memory capacitor, comprising the steps of: (a) sequentially forming an interlayer insulating film, a planarizing layer, a first insulation film, a first conduction layer and a second insulating film over a semiconductor substrate including a field oxide film, a gate oxide film and gates; (b) sequentially removing predetermined portions of the layers from the second insulating layer to the planarizing layer disposed over a region of the semiconductor substrate to be in contact with the capacitor is exposed, thereby forming a primary contact hold; (c) forming a first insulating spacer on an inner side wall of the primary contact hole, partially removing the interlayer insulating film by using the first insulating spacer as a mask to form a secondary contact hole, and completely removing the second insulating film to expose the first conduction layer; (d) forming a second conduction layer over the entire exposed surface of the resulting structure to cover the partially exposed first conduction layer and the first insulating spacer and fill the secondary contact hole, forming a third insulating film over the second conduction layer, and forming a fourth insulating film over the third insulating film, the fourth insulating film being made of a material exhibiting a superior etch selectivity to the third insulating film; (e) sequentially removing portions of the fourth insulating film and third insulating film disposed over the primary contact hole such that the third and fourth insulating films remain over a capacitor electrode region, thereby forming a pattern of the fourth insulating film and a pattern of the third insulating film disposed beneath the fourth insulating film pattern and having an undercut portion; (f) coating a third conduction layer over the entire exposed surface of the resulting structure such that the third conduction layer has a stepped portion filling the undercut portion of the third insulating film pattern by both the fourth insulating film pattern and the third insulating film pattern, and then forming a second insulating spacer on a side surface of the stepped portion of the third conduction layer; (g) sequentially removing exposed portions of the third, second and first conduction layers by an anisotropic etch process under a condition that the second insulating spacer is used as a mask, thereby isolating the capacitor while leaving the first conduction layer exposed inwardly of the second insulating spacer to a predetermined thickness; and (h) removing the first insulating spacer, the fourth insulation film pattern and the third insulating film pattern, and sequentially forming a fifth insulating film and a plate electrode.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

In a DRAM device, a plurality of longitudinally spaced gates as word lines and a plurality of laterally spaced bit lines as a metallic wiring are orthogonally arranged on a semiconductor substrate. Between neighboring gates, a capacitor is formed. A contact hole is formed at a central portion of the capacitor.

FIGS. 1A to 1H are sectional views respectively illustrating a method for fabricating a DRAM capacitor in accordance with an embodiment of the present invention.

Figure 1A:
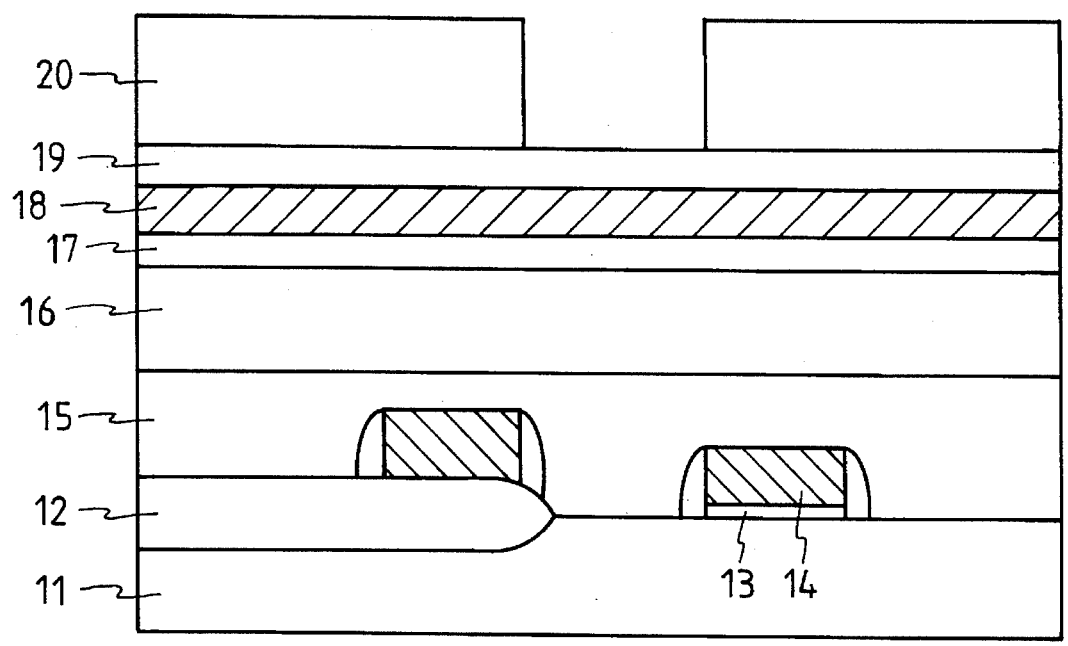
FIGS. 1A to 1H are sectional views respectively illustrating a method for fabricating a DRAM capacitor in accordance with an embodiment of the present invention.

In accordance with the method, first, a field oxide film 12 is formed on an element isolation region of a semiconductor substrate 11, as shown in FIG. 1A. A gate oxide film 13 and gates 14 are then formed on the semiconductor substrate 11 so as to obtain a general metal oxide silicon field effect transistor (MOSFET) structure. Over the entire exposed surface of the resulting structure, an interlayer insulating film 15, bit lines (not shown) and a planarizing layer 16 are sequentially formed.

Over the planarizing layer 16, a first insulating film 17, a first conduction layer 18 and a second insulating film 19 are sequentially formed. Thereafter, a photoresist pattern 20 is formed on the second insulating film 19 such that a predetermined portion of the second insulating film 19 to be in contact with a capacitor on the semiconductor substrate 11 is expose.

Figure 1B:
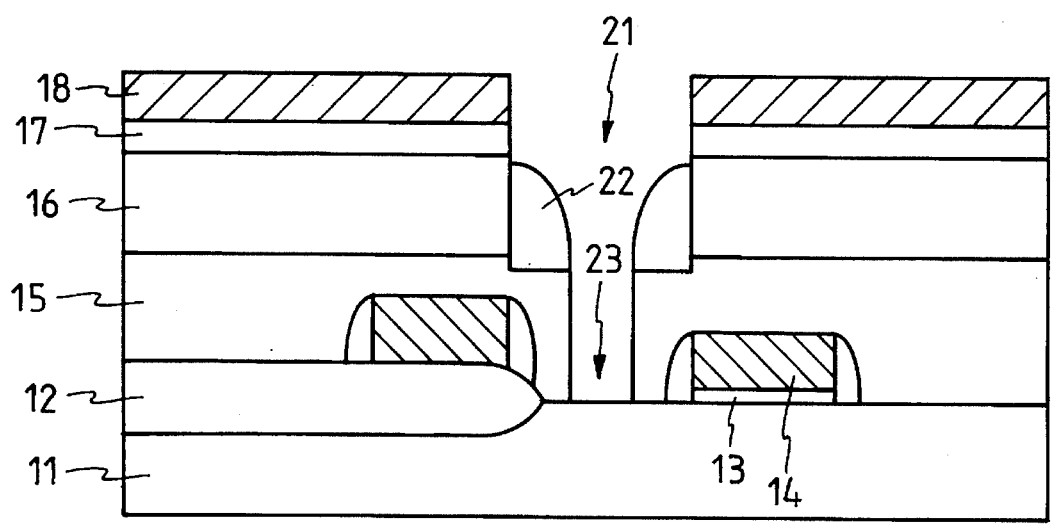

Using the photoresist pattern 20 as a mask, the layers from the second insulating film 19 to the planarizing layer 16 on the semiconductor substrate 11 are sequentially removed, thereby forming a primary contact hole 21, as shown in FIG. 1B. At this time, an upper portion of the interlayer insulating film is partially removed to a predetermined thickness.

Subsequently, the photoresist pattern 20 is removed. Over the entire exposed surface of the resulting structure, an oxide film is coated to a predetermined thickness. The oxide film is then removed at its full surface using an anisotropic etch process, thereby forming a first insulating spacer 22 on an inner side wall of the primary contact hole 21.

The etching is continued until a portion of the interlayer insulating film 15 exposed through an opening defined by the spacer 22 is completely removed, so that the region of the semiconductor substrate 11 to be in contact with the capacitor may be exposed. As a result, a secondary contract hole 23 is formed. During the continued etching, the second insulting film 19 is completely removed, thereby exposing the first conduction layer 18. Thus, a stepped contact hole is obtained by the two etching steps utilizing the insulating spacer.

Figure 1C:
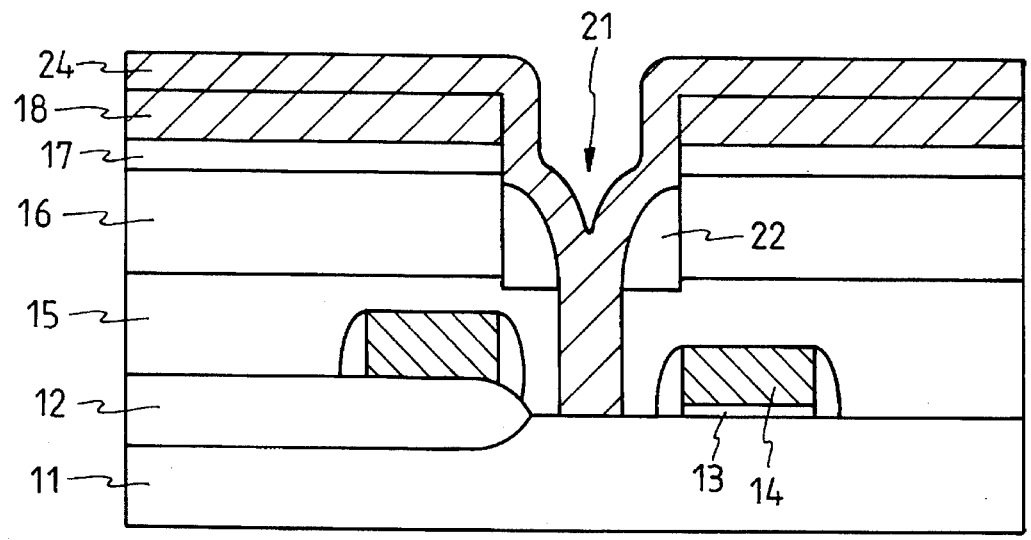

Over the entire exposed surface of the resulting structure, a second conduction layer 24 is coated to fill the secondary contact hole 23, as shown in FIG. 1C. The second conduction layer 24 also covers the first insulating spacer 22 and the first conduction layer 18.

Figure 1D:
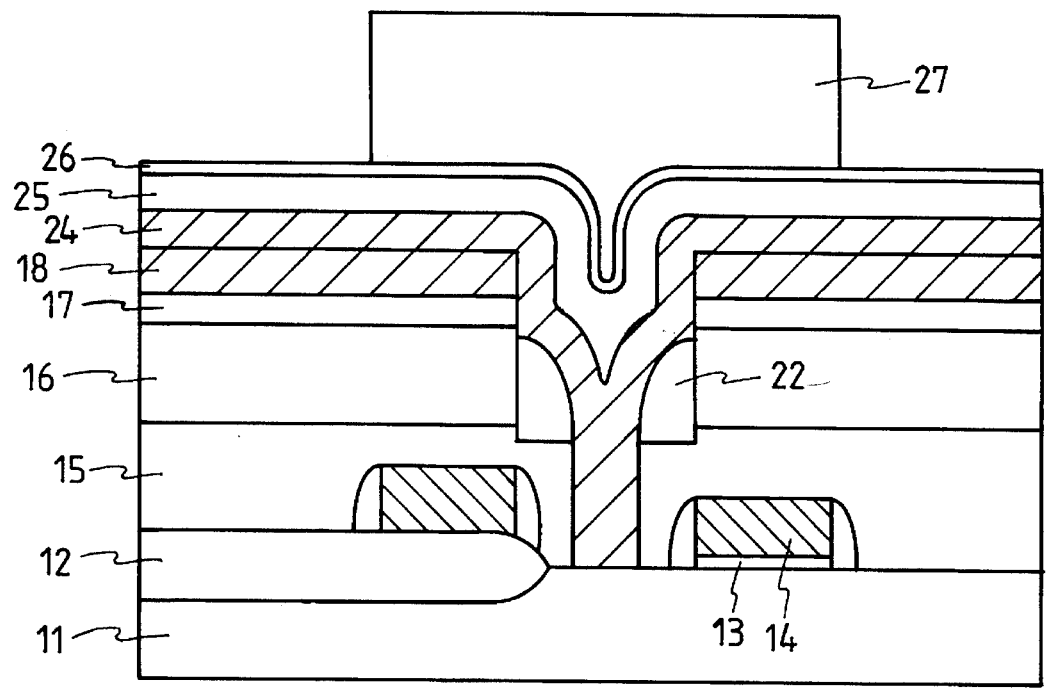

Thereafter, a third insulating film 25 and a fourth insulating film 26 are sequentially formed over the second conduction layer 24, as shown in FIG. 1D. The third insulating film 25 is made of a material exhibiting a superior etch selectivity to the fourth insulating film 26, taking into consideration a subsequent etching step. Preferably, the third insulating film 25 is made of tetraethylorthosilicate (TEOS) or a high temperature or intermediate temperature oxide film, while the fourth insulating film 26 is made of phospho silicate glass (PSG).

Figure 1E:
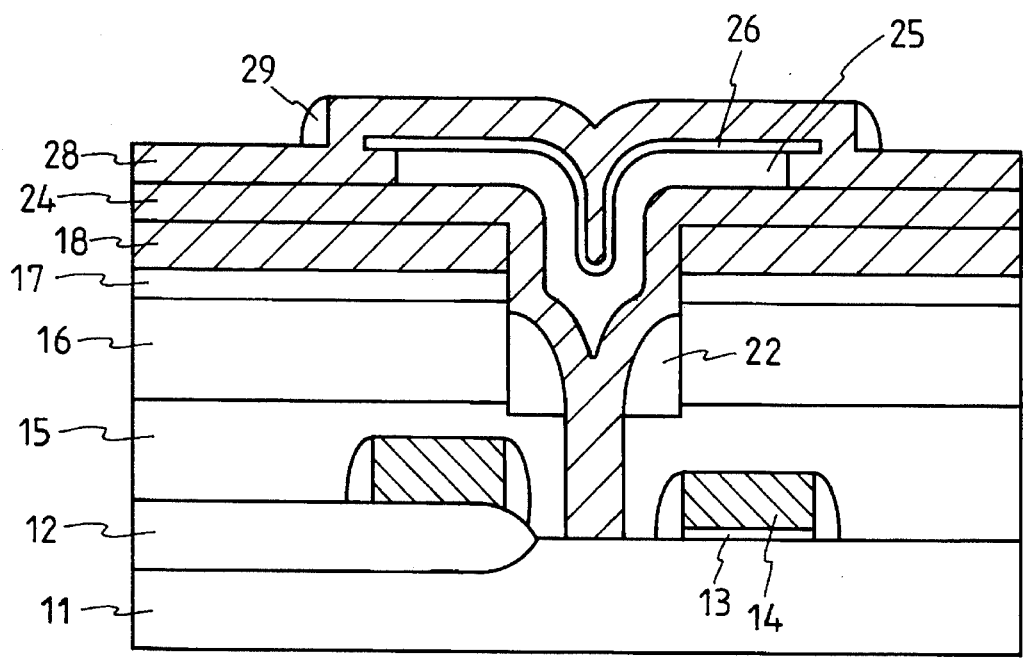

A photoresist pattern 27 is formed on a portion of the fourth insulating film 26 disposed over the primary contact hole 21. The photoresist pattern 27 protects the region which is to be the capacitor. The fourth insulating film 26 and the third insulating film 25 are then partially removed at their portions not covered with the photoresist pattern 27 using a dry etch process, thereby partially exposing the second conduction layer 24, as shown in FIG. 1E. Thereafter, the third insulating film 25 disposed beneath the fourth insulating film 26 is partially removed at its predetermined width portion using a wet etch process, thereby forming an undercut portion thereof. The photoresist pattern 27 is then completely removed. Since the third and fourth insulating films 25 and 26 are made of materials exhibiting a high wet etch rate difference, a pattern of the undercut third insulating film 25 is formed beneath the patterned fourth insulating film 26.

Over the entire exposed surface of the resulting structure, a third conduction layer 28 is then formed such that it fills the undercut portion of the third insulating film 25. Third conduction layer 28 has a stepped portion at an area where it fills the undercut portion of the third insulating film 25.

Subsequently, an oxide film (not shown) is coated over the entire exposed surface of the resulting structure. The oxide film is then etched at its full surface, thereby forming a second insulating spacer 29 on the stepped portion of the third conduction layer 28.

Figure 1F:
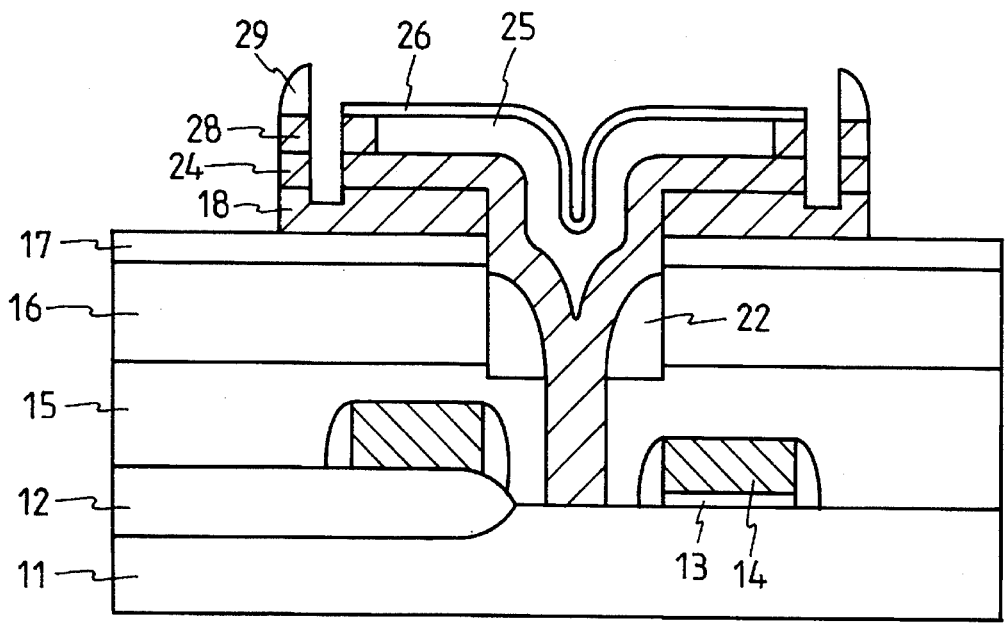

Using the second insulating spacer 29 as a mask, the third conduction layer 28, the second conduction layer 24 and the first conduction layer 18 are sequentially etched at their full surfaces, thereby isolating the capacitor, as shown in FIG. 1F. After completion of the etching, the first conduction layer 18 is left to a predetermined thickness because the third conduction layer 28 has a large thickness at the stepped portion disposed adjacent to the second insulating spacer 29.

Figure 1G:
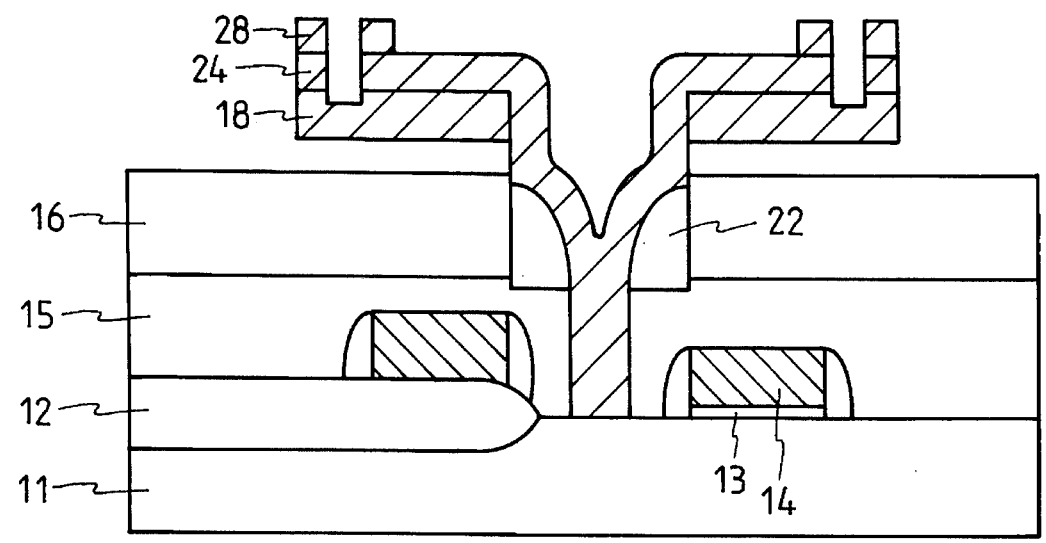

The patterns of the second insulating spacer 29, fourth insulating film 26 and third insulating film 25 are then completely removed, as shown in FIG. 1G. Simultaneously, the first insulating film 17 is completely removed. As a result, a capacitor electrode is formed which is constituted by the pattern of third conduction layer 28 having a double rectangular frame shape, the pattern of second conduction layer 24 filling the secondary contact hole 23 and disposed beneath the third conduction layer pattern, and the pattern of first conduction layer 18 disposed beneath the second conduction layer pattern. In some cases, the first insulating film 17 may not be removed.

Figure 1H:
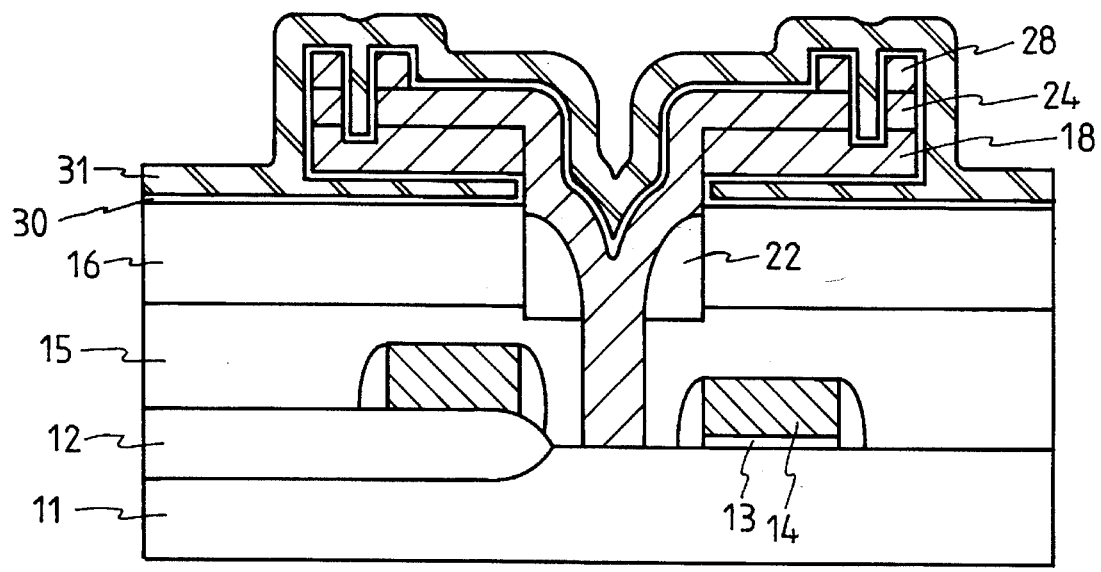

Over the entire exposed surface of the resulting structure including the patterns of conduction layers, a fifth insulating film 30 is formed, as shown in FIG. 1H. The fifth insulating film 30 is comprised of an oxide film, a nitride film or a multilayer having an oxide film-nitride film-oxide film structure. Thereafter, a plate electrode 31 of the general type is formed over the fifth insulating film 30.

As apparent from the above description, the present invention provides a method for fabricating a DRAM capacitor, including the steps of forming a double contact hole structure by utilizing an insulating spacer two times, filling only the lower portion of the contact hole, forming a pattern having an undercut portion from two insulating films exhibiting a superior wet etch rate difference, coating a conduction layer over the pattern to form an insulating spacer from a portion of the conduction layer disposed on the stepped pattern portion, and etching the resulting structure at its full surface using the insulating spacer as a mask to isolate a capacitor to be finally formed. By this method, a capacitor electrode having a double rectangular frame shape is formed. With such a structure, the inner area of the contact hole can be used as a part of the capacitor, thereby enabling the surface area of capacitor to be increased.

Since no separate mask is used for the etching step in accordance with the present invention, it is possible to simplify the fabrication of DRAM capacitor. Furthermore, the fabricated DRAM capacitor has a reduced contact area and an increased surface area. This achieves an increase in capacitance and improvement in integration degree while reducing the topology.

Although the preferred embodiments of the present invention have been disclosed for illustrative purpose, those skilled in the art will appreciate that various modifications, additions and substitutions are possible, without departing from the scope and spirit of the invention as disclosed in the accompanying claims.

What is claimed is:

1. A method for fabricating a dynamic random access memory capacitor, comprising the steps of:
    (a) sequentially forming an interlayer insulating film, a planarizing layer, a first insulating film, a first conduction layer and a second insulating film over a semiconductor substrate including a field oxide film, a gate oxide film and gates;
    (b) sequentially removing portions of the second insulating film, first conduction layer, first insulating film and the planarizing layer disposed over a region of the semiconductor substrate whereby said interlayer insulating film is exposed, thereby forming a primary contact hole;
    (c) forming a first insulating spacer on an inner side wall of the primary contact hole, partially removing the interlayer insulating film by using the first insulating spacer as a mask to form a secondary contact hole, and completely removing the second insulating film to expose the first conduction layer;
    (d) forming a second conduction layer over the entire exposed surface of the resulting structure to cover the exposed first conduction layer and the first insulating spacer and fill the secondary contact hole, forming a third insulating film over the second conduction layer, and forming a fourth insulating film over the third insulating film, the fourth insulating film being made of a material exhibiting a slower etch rate than said third insulating film;
    (e) sequentially removing portions of the fourth insulating film and third insulating film disposed over the primary contact hole and wet etching to selectively remove exposed portions of said third insulating film, thereby forming a pattern of the fourth insulating film and a pattern of the third insulating film disposed beneath the fourth insulating film pattern and having an undercut portion;
    (f) coating a third conduction layer over the entire exposed surface of the resulting structure such that the third conduction layer has a stepped portion filling the undercut portion of the third insulating film pattern by both the fourth insulating film pattern and the third insulating film pattern, and then forming a second insulating spacer on a side surface of the stepped portion of the third conduction layer;
    (g) sequentially removing exposed portions of the third, second and first conduction layers by an anisotropic etch process under a condition that the second insulating spacer and fourth insulating layer are used as masks, thereby isolating a capacitor while a portion of the first conduction layer exposed between the fourth insulating layer and the second insulating spacer is not removed; and
    (h) removing the second insulating spacer, the fourth insulating film pattern and the third insulating film pattern, and sequentially forming a fifth insulating film over exposed surfaces of said conduction and planarizing layers and forming a plate electrode over said fifth insulating film.

2. A method in accordance with claim 1, wherein the first, second and third conduction layers respectively formed at the steps (a), (d) and (f) are made of a material independently selected from the group consisting of polysilicon and amorphous silicon.

3. A method in accordance with claim 1, wherein the third insulating film formed at the step (d) is made from tetraethylorthosilicate and the fourth insulating film formed at the step (d) is made of a phosphosilicate glass.

4. A method in accordance with claim 1, wherein the formation of each of the first and second insulating spacers respectively formed at the steps (c) and (f) is achieved by coating an oxide film over the entire exposed surface of the resulting structure obtained just prior to the formation of each corresponding insulating spacer, and then etching the oxide film at its full surface.

5. A method in accordance with claim 1, wherein the third insulating film formed at the step (d) is made of a high temperature oxide film and the fourth insulating film formed at step (d) is made of a phosphosilicate glass.

6. A method in accordance with claim 1, wherein the third insulating film formed at the step (d) is made of an intermediate temperature oxide film and the fourth insulating film formed at step (d) is made of a phosphosilicate glass.

* * * * *